(12) United States Patent
Wei et al.

(10) Patent No.: US 12,388,424 B2
(45) Date of Patent: Aug. 12, 2025

(54) DUTY CYCLE CALIBRATION CIRCUIT AND METHOD

(71) Applicant: MONTAGE TECHNOLOGY (KUNSHAN) CO., LTD., Jiangsu (CN)

(72) Inventors: Kang Wei, Suzhou (CN); Jinfu Chen, Suzhou (CN); Liang Zhang, Suzhou (CN)

(73) Assignee: MONTAGE TECHNOLOGY (KUNSHAN) CO., LTD., Suzhou (CN)

( * ) Notice: Subject to any disclaimer, the term of this patent is extended or adjusted under 35 U.S.C. 154(b) by 59 days.

(21) Appl. No.: 18/368,992

(22) Filed: Sep. 15, 2023

(65) Prior Publication Data

US 2024/0097660 A1 Mar. 21, 2024

(30) Foreign Application Priority Data

Sep. 16, 2022 (CN) .......................... 202211131807.X

(51) Int. Cl.
*H03K 3/017* (2006.01)
*H03K 3/011* (2006.01)
(Continued)

(52) U.S. Cl.
CPC ............. *H03K 3/017* (2013.01); *H03K 3/011* (2013.01); *H03K 5/135* (2013.01); *H03K 5/1565* (2013.01)

(58) Field of Classification Search
CPC ...... H03K 5/1565; H03K 5/135; H03K 3/011; H03K 3/017; H03K 5/131; H03K 5/133; H03K 19/01837; H03L 7/099; H03L 2207/06; H03L 7/0802; H03L 7/0805; H03L 7/091; H03L 7/093; H03L 7/097; H03L 7/0992; H03L 7/1976; H03L 7/08; H03L 7/18; H03L 7/24; H03L 7/0814; H03L 7/085; H03L 7/0998; G06F 1/10;
(Continued)

(56) References Cited

U.S. PATENT DOCUMENTS 6,327,318 B1 * 12/2001 Bhullar ................... H03L 7/089
375/374
2007/0182469 A1 * 8/2007 Zimlich ................ H03L 7/0814
327/158

(Continued)

*Primary Examiner* — John W Poos
(74) *Attorney, Agent, or Firm* — Oliff PLC

(57) ABSTRACT

A duty cycle calibration circuit includes delay, temperature compensation, differential, and phase adjustment units. The delay adjustment unit receives a single-ended input clock signal to be calibrated and an adjustment voltage and outputs a single-ended clock signal adjusted by the adjustment voltage. The temperature compensation adjustment unit determines the adjustment voltage output by the temperature compensation adjustment unit, and provides the adjustment voltage to the delay adjustment unit to eliminate the influence of the temperature on the duty cycle. The differential adjustment unit converts the single-ended clock signal into a differential clock signal, and adjusts delay of the differential clock signal. The phase adjustment unit receives the adjusted differential clock signal to adjust its phase and converts it into a single-ended output clock signal after phase adjustment, and makes rising and falling edges of the single-ended output clock signal correspond to rising edges of the adjusted differential clock signal respectively.

8 Claims, 2 Drawing Sheets

(51) Int. Cl.
*H03K 5/135* (2006.01)
*H03K 5/156* (2006.01)

(58) Field of Classification Search
CPC .... G06F 1/12; G06F 13/1689; G06F 13/4234; G06F 13/4243; G06F 1/04; G06F 1/06
See application file for complete search history.

(56) References Cited

U.S. PATENT DOCUMENTS

| | | | | |
|---|---|---|---|---|
| 2010/0194454 | A1* | 8/2010 | Ito | H04N 25/745 327/154 |
| 2014/0176201 | A1* | 6/2014 | Weltin-Wu | H03K 5/131 327/115 |

* cited by examiner

DUTY CYCLE CALIBRATION CIRCUIT AND METHOD

CROSS-REFERENCE TO PRIOR APPLICATION

This application claims priority to Chinese Application number CN202211131807.X which is filed on Sep. 16, 2022, the contents of which are incorporated herein by reference.

TECHNICAL FIELD

The disclosure generally relates to the technical field of semiconductor, in particular to a duty cycle calibration circuit and a duty cycle calibration method.

BACKGROUND

When calibrating the duty cycle of a clock signal, a differential signal of the clock signal are usually input into two symmetrically delay adjustment units respectively, and then the delay of the signals output from these two delay adjustment units is adjusted. However, in high-speed circuits, the power consumption introduced by the two delay adjustment units cannot be ignored, which is not conducive to the design of high-speed and low-power circuits.

SUMMARY OF THE INVENTION

An object of the present application is to provide a duty cycle calibration circuit and method for reducing the static and dynamic power consumption of the clock signal while ensuring the consistency of the duty cycle of the clock signal at different temperatures.

The application discloses a duty cycle calibration circuit, comprising:
   a delay adjustment unit for receiving a single-ended input clock signal to be calibrated and an adjustment voltage and outputting a single-ended clock signal adjusted by the adjustment voltage;
   a temperature compensation adjustment unit connected to the delay adjustment unit for determining the adjustment voltage output by the temperature compensation adjustment unit based on the relationships between duty cycle, temperature and adjustment voltage, and providing the adjustment voltage to the delay adjustment unit to eliminate influence of the temperature on the duty cycle;
   a differential adjustment unit connected to the delay adjustment unit for converting the single-ended clock signal into a differential clock signal and adjusting delay of the differential clock signal based on a delay adjustment signal; and
   a phase adjustment unit connected to the differential adjustment unit for receiving the adjusted differential clock signal to adjust its phases and converting it into a single-ended output clock signal after phase adjustment, and making rising and falling edges of the single-ended output clock signal correspond to rising edges of the adjusted differential clock signal respectively.

In an embodiment, the differential adjustment unit comprises a buffer, an inverter, a first delay fine adjustment unit, and a second delay fine adjustment unit, wherein the buffer is connected between an output end of the delay adjustment unit and an input end of the first delay fine adjustment unit, the inverter is connected between the output end of the delay adjustment unit and an input end of the second delay adjustment unit;
   the buffer and the inverter receive the single-ended clock signal and output an in-phase signal and a reversed-phase signal forming the differential clock signal respectively;
   the first delay fine adjustment unit and the second delay fine adjustment unit respectively receive the in-phase signal and the reversed-phase signal of the differential clock signal and perform delay adjustment on them.

In an embodiment, the temperature compensation adjustment unit determines a temperature coefficient of the adjustment voltage based on the relationship between the duty cycle and temperature, as well as the relationship between the duty cycle and the adjustment voltage, and outputs the adjustment voltage with the temperature coefficient.

In one embodiment, the circuit also includes:
   an error detection unit connected to an output end of the phase adjustment unit for performing error detection on the duty cycle of the single-ended output clock signal; and
   a calibration control unit connected between the error detection unit and the differential adjustment unit for generating the delay adjustment signal based on a result of the error detection and outputting the delay adjustment signal to the differential adjustment unit.

The application discloses a duty cycle calibration method, wherein the method is applied to a duty cycle calibration circuit which includes a delay adjustment unit, a temperature compensation adjustment unit, a differential adjustment unit and a phase adjustment unit, the method comprises:
   receiving, by the delay adjustment unit, a single-ended input clock signal to be calibrated and an adjustment voltage and outputting a single-ended clock signal adjusted by the adjustment voltage;
   determining, by the temperature compensation adjustment unit, the output adjustment voltage based on the relationships between duty cycle, temperature and adjustment voltage, and providing the adjustment voltage to the delay adjustment unit to eliminate influence of the temperature on the duty cycle;
   converting, by the differential adjustment unit, the single-ended clock signal adjusted by the adjustment voltage into a differential clock signal, and adjusting delay of the differential clock signal based on a delay adjustment signal; and
   receiving, by the phase adjustment unit, the adjusted differential clock signal to adjust its phases and converting it into a single-ended output clock signal after phase adjustment, and making rising and falling edges of the single-ended output clock signal correspond to rising edges of the adjusted differential clock signal respectively.

In an embodiment, the differential adjustment unit comprises a buffer, an inverter, a first delay fine adjustment unit, and a second delay fine adjustment unit, wherein the method further comprises:
   receiving, by the buffer and the inverter, the single-ended clock signal and outputting an in-phase signal and a reversed-phase signal forming differential clock signal respectively;
   receiving, by the first delay fine adjustment unit and the second delay fine adjustment unit, the in-phase signal and the reversed-phase signal differential clock signal respectively and performing delay adjustment on them.

In an embodiment, determining the output adjustment voltage based on the relationships between duty cycle with temperature and the adjustment voltage by the temperature compensation adjustment unit, comprises: determining, by the temperature compensation adjustment unit, a temperature coefficient of the adjustment voltage based on the relationship between the duty cycle and temperature, as well as the relationship between the duty cycle and the adjustment voltage, and outputting the adjustment voltage with the temperature coefficient.

In an embodiment, the duty cycle calibration circuit further comprises an error detection unit and a calibration control unit; the method further includes:

performing, by the error detection unit, error detection on the duty cycle of the single-ended output clock signal; and generating, by the calibration control unit, the delay adjustment signal based on a result of the error detection, and outputting the delay adjustment signal to the differential adjustment unit.

This application proposes a clock duty cycle calibration scheme with temperature compensation. The clock signal is converted from a single-ended signal to differential signals and then to a single-ended signal during transmission, which significantly reduces the static and dynamic power consumption of the clock signal. Furthermore, this application determines the temperature coefficient of the adjustment voltage based on the relationship between the duty cycle and temperature, and provides the adjustment voltage with the temperature coefficient to the delay adjustment unit, which can eliminate the impact of temperature changes on the migration time of the rising edge and the falling edge of the clock signal, thereby ensuring the consistency of the clock duty cycle at different temperatures. A large number of technical features are described in the specification of the present application, and are distributed in various technical solutions. If a combination (i.e., a technical solution) of all possible technical features of the present application is listed, the description may be made too long. In order to avoid this problem, the various technical features disclosed in the above summary of the present application, the technical features disclosed in the various embodiments and examples below, and the various technical features disclosed in the drawings can be freely combined with each other to constitute Various new technical solutions (all of which are considered to have been described in this specification), unless a combination of such technical features is not technically feasible. For example, feature A+B+C is disclosed in one example, and feature A+B+D+E is disclosed in another example, while features C and D are equivalent technical means that perform the same function, and technically only choose one, not to adopt at the same time. Feature E can be combined with feature C technically. Then, the A+B+C+D scheme should not be regarded as already recorded because of the technical infeasibility, and A+B+C+E scheme should be considered as already documented.

DETAILED DESCRIPTION

In the following description, numerous technical details are set forth in order to provide the readers with a better understanding of the present application. However, those skilled in the art can understand that the technical solutions claimed in the present application can be implemented without these technical details and various changes and modifications based on the following embodiments.

In order to make the objects, technical solutions and advantages of the present application more clear, embodiments of the present application will be further described in detail below with reference to the accompanying drawings.

Figure 1:
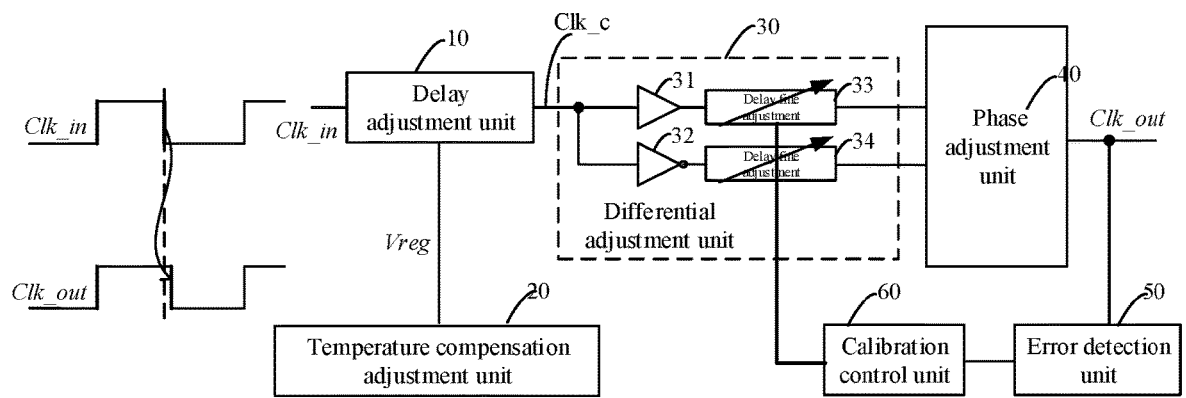
FIG. 1 shows a schematic diagram of a duty cycle calibration circuit with temperature compensation in an embodiment of the present application.

As shown in FIG. 1, the transmission process of a clock signal in an embodiment of this application is as follows: a single-ended clock signal is input and converted into a differential clock signal, and then the differential clock signal is converted into a first single-ended clock signal for output. That is, a single-ended input clock signal Clk_in is divided into a differential clock signal with an in-phase signal and a reversed-phase signal after passing through the delay adjustment unit 10, then the differential clock signals are input into two delay fine adjustment units 33, 34 respectively and "synthesized" as an output single-ended output clock signal Clk_out by the phase adjustment unit 40. This signal transmission process can significantly reduce power consumption compared to prior art.

Figure 2:
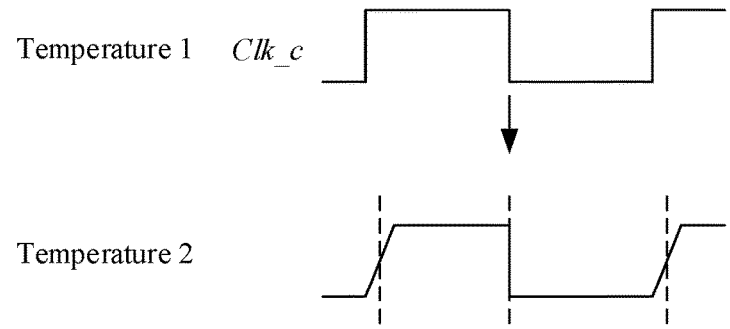
FIG. 2 shows a schematic diagram of the clock signal varying with temperature in an embodiment of the present application.

In addition, considering the influence of temperature, the changes in the rising and falling edge migration time of the clock signal are not consistent, which results in the duty cycle varying with temperature. For example, it is assumed that the change in the rising edge migration time is greater than the change in the falling edge migration time after the temperature changes, as shown in FIG. 2, which shows the duty cycles of the clock signal Clk_c output after passing through the delay adjustment unit 10 at temperature 1 and temperature 2. The changes in the rising and falling edge migration time of the clock signal Clk_c, after in-phase and reversed-phase transmission respectively, are eventually reflected in the single-ended output clock signal Clk_out. Therefore, in order to eliminate the influence of temperature on the rising edge migration time and the falling edge migration time of the single-ended clock signal, the embodiment of the present application introduces a temperature coefficient on the voltage provided to the delay adjustment unit 10 at the input end of the signal, that is, provides a voltage with the temperature coefficient to the delay adjustment unit to eliminate the influence of temperature on the duty cycle.

The present application discloses a duty cycle calibration circuit with temperature compensation, as shown in FIG. 1, the circuit includes a delay adjustment unit 10, a temperature compensation adjustment unit 20, a differential adjustment unit 30 and a phase adjustment unit 40.

The delay adjustment unit 10 is used for receiving a single-ended input clock signal Clk_in to be calibrated and an adjustment voltage Vreg, and outputting a single-ended clock signal Clk_c adjusted by the adjustment voltage.

The temperature compensation adjustment unit 20 is connected to the delay adjustment unit 10, and is used for determining the adjustment voltage Vreg output by the temperature compensation adjustment unit 20 based on the relationships between duty cycle with temperature and adjustment voltage, and providing the adjustment voltage to the delay adjustment unit 10 to eliminate influence of the temperature on the duty cycle.

The differential adjustment unit 30 is connected to the delay adjustment unit 10 and is used for converting the single-ended clock signal Clk_c into a differential clock signal and adjusting delay of the differential clock signal based on a delay adjustment signal.

The phase adjustment unit 40 is connected to the differential adjustment unit 30 and is used for receiving the adjusted differential clock signal to adjust its phases, and converting it into a single-ended output clock signal after phase adjustment, and making rising and falling edges of the single-ended output clock signal correspond to rising edges of the differential clock signal respectively.

Figure 3:
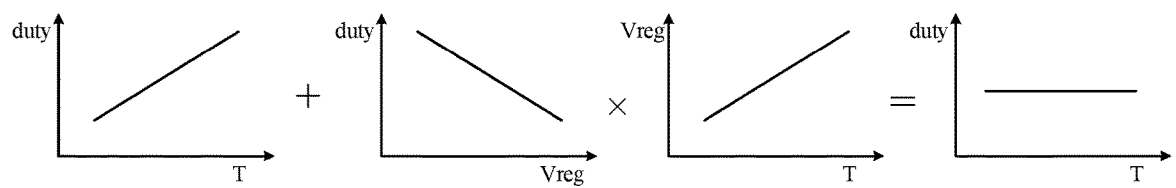
FIG. 3 shows a schematic diagram of temperature compensation in an embodiment of the present application.

In one embodiment, the delay adjustment unit 10 performs delay adjustment on the received single-ended input clock signal Clk_in, and the adjustment voltage with temperature coefficient supplied to the delay adjustment unit 10 by the temperature compensation adjustment unit 20 can eliminate the influence of the temperature on the duty cycle of the single-ended input clock signal Clk_in. In an embodiment, the temperature compensation adjustment unit 20 determines the temperature coefficient of the adjustment voltage based on the relationship between the duty cycle and temperature, as well as the relationship between the duty cycle and the adjustment voltage, and outputs the adjustment voltage with the temperature coefficient to the delay adjustment unit 10. In the embodiment, a certain temperature coefficient can be introduced to the adjustment voltage Vreg to compensate the impact of the temperature on the duty cycle. As shown in FIG. 3, assuming that the duty cycle has a positive temperature coefficient (i.e., the duty cycle is directly proportional to the temperature T), and the duty cycle decreases with the increase of the adjustment voltage Vreg (i.e., the duty cycle is inversely proportional to the adjustment voltage Vreg). In this case, we only need to provide an adjustment voltage Vreg with a positive temperature coefficient to compensate the impact of temperature on the duty cycle. It can be understood that FIG. 3 is only an example, and the relationship between the duty cycle and temperature as well as the relationship between the duty cycle and the adjustment voltage should be determined based on the actual situation and not limited to this.

The delay adjustment unit 10 outputs the single-ended clock signal Clk_c adjusted by the adjustment voltage to the differential adjustment unit 30. In an embodiment, the differential adjustment unit 30 comprises a buffer 31, an inverter 32, a first delay fine adjustment unit 33, and a second delay fine adjustment unit 34. The buffer 31 is connected between an output end of the delay adjustment unit 10 and an input end of the first delay fine adjustment unit 33, and the inverter 32 is connected between the output end of the delay adjustment unit 10 and an input end of the second delay adjustment unit 34. The single-ended clock signal Clk_c is input into the buffer 31 and the inverter 32 respectively, and an in-phase signal output by the buffer 31 and a reversed-phase signal output by the inverter 32 form differential clock signals. The first delay fine adjustment unit 33 and the second delay fine adjustment unit 34 receive the in-phase signal and the reversed-phase signal of the differential clock signal respectively and perform delay adjustment on them.

In an embodiment, the circuit further comprises an error detection unit 50 and a calibration control unit 60. The error detection unit 50 is connected to an output end of the phase adjustment unit 40 and is used for performing error detection on the duty cycle of the single-ended output clock signal.

The calibration control unit 60 is connected between the error detection unit 50 and the differential adjustment unit 30, and is used for generating the delay adjustment signal based on a result of the error detection and outputting the delay adjustment signal to the differential adjustment unit 30. By the error detection circuit and the calibration algorithm of the calibration control unit, the delay of the fine adjustment unit can be adjusted to calibrate the duty cycle of the clock signal.

Figure 4:
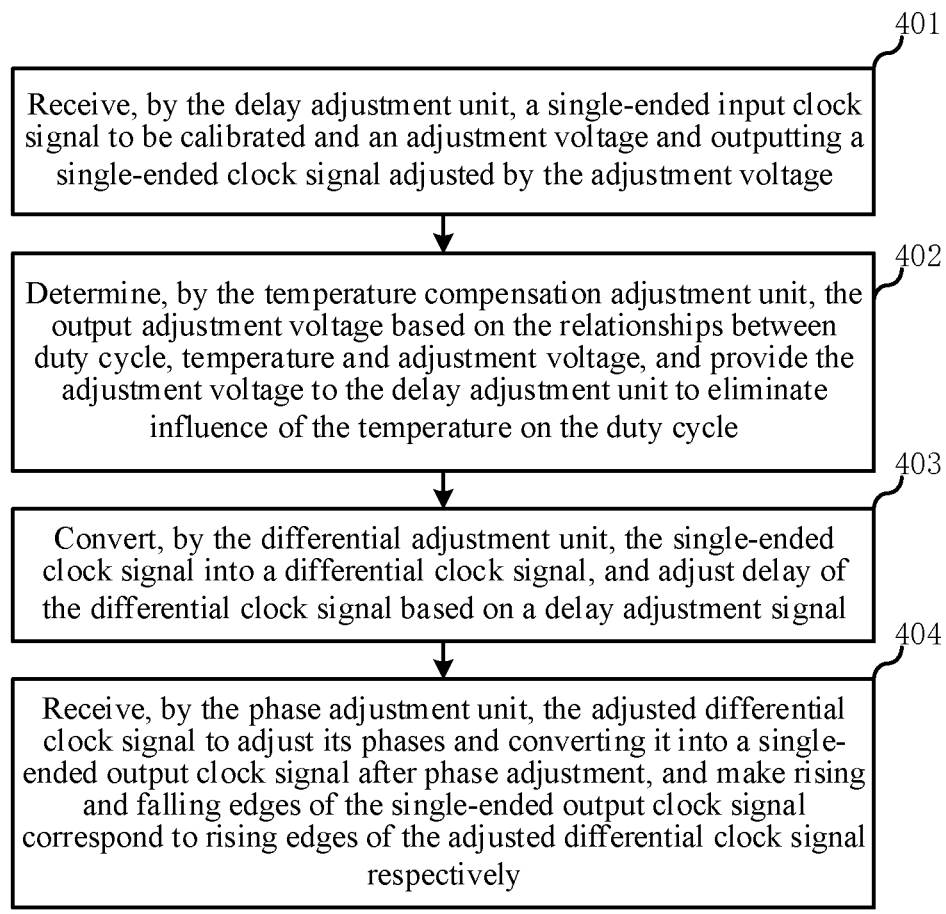
FIG. 4 shows a flowchart of a duty cycle calibration method in an embodiment of the present application.

The present application also discloses a duty cycle calibration method, wherein the method is applied to the duty cycle calibration circuit as shown in FIG. 1, the circuit includes a delay adjustment unit, a temperature compensation adjustment unit, a differential adjustment unit and a phase adjustment unit. As shown in FIG. 4, the method includes:

At step 401, receiving, by the delay adjustment unit, a single-ended input clock signal to be calibrated and an adjustment voltage and outputting a single-ended clock signal Clk_c adjusted by the adjustment voltage.

At step 402, determining, by the temperature compensation adjustment unit, an adjustment voltage based on relationships between duty cycle, temperature and the adjustment voltage, and providing the adjustment voltage to the delay adjustment unit to eliminate the influence of the temperature on the duty cycle.

At step 403, converting, by the differential adjustment unit, the single-ended clock signal Clk_c into a differential clock signal, and adjusting delay of the differential clock signal based on a delay adjustment signal.

At step 404, receiving, by the phase adjustment unit, the adjusted differential clock signal to adjust its phases and converting it into a single-ended output clock signal after phase adjustment, and making rising and falling edges of the single-ended output clock signal correspond to rising edges of the adjusted differential clock signal respectively.

In an embodiment, determining the adjustment voltage based on the relationships between duty cycle, temperature and the adjustment voltage by the temperature compensation adjustment unit, comprises: determining, by the temperature compensation adjustment unit, a temperature coefficient of the adjustment voltage based on the relationship between the duty cycle and temperature as well as the relationship between the duty cycle and the adjustment voltage, and outputting the adjustment voltage with the temperature coefficient.

In an embodiment, the differential adjustment unit comprises a buffer, an inverter, a first delay fine adjustment unit, and a second delay fine adjustment unit, wherein the method further comprises:

receiving, by the buffer and the inverter, the single-ended clock signal and outputting an in-phase signal and a reversed-phase signal forming the differential clock signals respectively;

receiving, by the first delay fine adjustment unit and the second delay fine adjustment unit, the in-phase signal and the reversed-phase signal of the differential clock signals respectively and performing delay adjustment on them.

In an embodiment, the duty cycle calibration circuit further comprises an error detection unit and a calibration control unit; the method further includes:

performing, by the error detection unit, error detection on the duty cycle of the single-ended output clock signal; and generating, by the calibration control unit, the delay adjustment signal based on a result of the error detection, and outputting the delay adjustment signal to the differential adjustment unit.

The embodiments of this application adopt a signal transmission method of "converting a single-ended input clock signal to a differential clock signal and then converting the differential clock signal to a single-ended output time signal", which significantly reduces the static and dynamic power consumption of the clock signal. Furthermore, the present application also provides the adjustment voltage with the temperature compensation to delay adjustment unit to eliminate the impact of temperature changes in the rising edge and the falling edge migration time of the clock signal, which can ensure the consistency of the duty cycle of the clock signal under different temperatures.

It should be noted that in this specification of the application, relational terms such as the first and second, and so on are only configured to distinguish one entity or operation from another entity or operation, and do not necessarily require or imply any such actual relationship or order between these entities or operations. Furthermore, the term "comprises" or "comprising" or "includes" or any other variations thereof is intended to encompass a non-exclusive inclusion, such that a process, method, article, or device that comprises a multiple elements includes not only those elements but also other elements, or elements that are inherent to such a process, method, item, or device. Without more restrictions, the element defined by the phrase "comprise(s) a/an" does not exclude that there are other identical elements in the process, method, item or device that includes the element. In this specification of the application, if it is mentioned that an action is performed according to an element, it means the meaning of performing the action at least according to the element, and includes two cases: the action is performed only on the basis of the element, and the action is performed based on the element and other elements. Multiple, repeatedly, various, etc., expressions include 2, twice, 2 types, and 2 or more, twice or more, and 2 types or more types.

The term "coupled to" and its derivatives can be used herein. "Coupled" may mean that two or more elements are in direct physical or electrical contact. However, "coupled" may also mean that two or more elements are indirectly in contact with each other, but still cooperate or interact with each other, and may mean that one or more other elements are coupled between elements that are said to be coupled to or connected with each other.

The specification includes combinations of the various embodiments described herein. Separate references to embodiments (such as "an embodiment" or "some embodiments" or "preferred embodiments") do not necessarily refer to the same embodiment; however, these embodiments are not mutually exclusive unless indicated as mutually exclusive or clearly mutually exclusive by those skilled in the art. It should be noted that unless the context clearly indicates or requires otherwise, the word "or" is used in this specification in a non-exclusive sense.

All documents mentioned in this specification are considered to be included in the disclosure of this application as a whole, so that they can be used as a basis for modification when necessary. In addition, it should be understood that the above descriptions are only preferred embodiments of this specification, and are not intended to limit the protection scope of this specification. Any modification, equivalent replacement, improvement, etc. made within the spirit and principle of one or more embodiments of this specification should be included in the protection scope of one or more embodiments of this specification.

What is claimed is:

1. A duty cycle calibration circuit, comprising:
    a delay adjustment unit for receiving a single-ended input clock signal to be calibrated and an adjustment voltage and outputting a single-ended clock signal adjusted by the adjustment voltage;
    a temperature compensation adjustment unit connected to the delay adjustment unit for determining the adjustment voltage output by the temperature compensation adjustment unit based on the relationships between duty cycle, temperature and adjustment voltage, and providing the adjustment voltage to the delay adjustment unit to eliminate influence of the temperature on the duty cycle;
    a differential adjustment unit connected to the delay adjustment unit for converting the single-ended clock signal into a differential clock signal and adjusting delay of the differential clock signal based on a delay adjustment signal; and
    a phase adjustment unit connected to the differential adjustment unit for receiving the adjusted differential clock signal to adjust its phases, and converting it into a single-ended output clock signal after phase adjustment, and making rising and falling edges of the single-ended output clock signal correspond to rising edges of the adjusted differential clock signal respectively.

2. The duty cycle calibration circuit according to claim 1, wherein the differential adjustment unit comprises a buffer, an inverter, a first delay fine adjustment unit, and a second delay fine adjustment unit, wherein the buffer is connected between an output end of the delay adjustment unit and an input end of the first delay fine adjustment unit, the inverter is connected between the output end of the delay adjustment unit and an input end of the second delay adjustment unit;
    the buffer and the inverter receive the single-ended clock signal and output an in-phase signal and a reversed-phase signal forming the differential clock signal respectively;
    the first delay fine adjustment unit and the second delay fine adjustment unit respectively receive the in-phase signal and the reversed-phase signal of the differential clock signal and perform delay adjustment on them.

3. The duty cycle calibration circuit according to claim 1, wherein the temperature compensation adjustment unit determines a temperature coefficient of the adjustment voltage based on the relationship between the duty cycle and temperature, as well as the relationship between the duty cycle and the adjustment voltage, and outputs the adjustment voltage with the temperature coefficient.

4. The duty cycle calibration circuit according to claim 1, further comprising:
    an error detection unit connected to an output end of the phase adjustment unit for performing error detection on the duty cycle of the single-ended output clock signal; and
    a calibration control unit connected between the error detection unit and the differential adjustment unit for generating the delay adjustment signal based on a result of the error detection and outputting the delay adjustment signal to the differential adjustment unit.

5. A duty cycle calibration method, wherein the method is applied to a duty cycle calibration circuit which comprises a delay adjustment unit, a temperature compensation adjustment unit, a differential adjustment unit and a phase adjustment unit, the method comprises:

receiving, by the delay adjustment unit, a single-ended input clock signal to be calibrated and an adjustment voltage and outputting a single-ended clock signal adjusted by the adjustment voltage;

determining, by the temperature compensation adjustment unit, the output adjustment voltage based on the relationships between duty cycle, temperature and adjustment voltage, and providing the adjustment voltage to the delay adjustment unit to eliminate influence of the temperature on the duty cycle;

converting, by the differential adjustment unit, the single-ended clock signal into a differential clock signal, and adjusting delay of the differential clock signal based on a delay adjustment signal; and receiving, by the phase adjustment unit, the adjusted differential clock signal to adjust its phases and converting it into a single-ended output clock signal after phase adjustment, and making rising and falling edges of the single-ended output clock signal correspond to rising edges of the adjusted differential clock signal respectively.

6. The duty cycle calibration method according to claim 5, wherein the differential adjustment unit comprises a buffer, an inverter, a first delay fine adjustment unit, and a second delay fine adjustment unit, wherein the method further comprises:

receiving, by the buffer and the inverter, the single-ended clock signal and outputting an in-phase signal and a reversed-phase signal forming the differential clock signal respectively;

receiving, by the first delay fine adjustment unit and the second delay fine adjustment unit, the in-phase signal and the reversed-phase signal of the differential clock signal respectively and performing delay adjustment on them.

7. The duty cycle calibration method according to claim 5, wherein determining the output adjustment voltage based on the relationships between duty cycle, temperature and the adjustment voltage by the temperature compensation adjustment unit, comprises: determining, by the temperature compensation adjustment unit, a temperature coefficient of the adjustment voltage based on the relationship between the duty cycle and temperature, as well as the relationship between the duty cycle and the adjustment voltage, and outputting the adjustment voltage with the temperature coefficient.

8. The duty cycle calibration method according to claim 5, wherein the duty cycle calibration circuit further comprises an error detection unit and a calibration control unit; the method further comprises:

performing, by the error detection unit, error detection on the duty cycle of the single-ended output clock signal; and generating, by the calibration control unit, the delay adjustment signal based on a result of the error detection, and outputting the delay adjustment signal to the differential adjustment unit.

* * * * *